(12) United States Patent
Yu et al.

(10) Patent No.: US 11,796,874 B2
(45) Date of Patent: Oct. 24, 2023

(54) DISPLAY PANEL

(71) Applicant: Wuhan China Star Optoelectronics Technology Co., Ltd., Hubei (CN)

(72) Inventors: Wenqiang Yu, Hubei (CN); Chao Wang, Hubei (CN)

(73) Assignee: Wuhan China Star Optoelectronics Technology Co., Ltd., Wuhan (CN)

( * ) Notice: Subject to any disclaimer, the term of this patent is extended or adjusted under 35 U.S.C. 154(b) by 300 days.

(21) Appl. No.: 17/281,599

(22) PCT Filed: Mar. 12, 2021

(86) PCT No.: PCT/CN2021/080366
§ 371 (c)(1),
(2) Date: Mar. 31, 2021

(87) PCT Pub. No.: WO2022/151576
PCT Pub. Date: Jul. 21, 2022

(65) Prior Publication Data
US 2023/0152643 A1     May 18, 2023

(30) Foreign Application Priority Data

Jan. 15, 2021    (CN) .......................... 202110055616.9

(51) Int. Cl.
     *G02F 1/1362*      (2006.01)
     *G02F 1/1368*      (2006.01)
(52) U.S. Cl.
     CPC ...... *G02F 1/136209* (2013.01); *G02F 1/1368* (2013.01); *G02F 1/136227* (2013.01); *G02F 1/136286* (2013.01)

(58) Field of Classification Search
CPC ................................................... G02F 1/1362
See application file for complete search history.

(56) References Cited

U.S. PATENT DOCUMENTS

| 5,956,103 A * | 9/1999 | Ishiguro ............ G02F 1/136213 349/111 |
|---|---|---|
| 2010/0078666 A1* | 4/2010 | Mochiku ............... H01L 27/124 257/E33.053 |
| 2010/0176381 A1* | 7/2010 | Yagi ....................... H10K 19/10 257/40 |
| 2011/0024848 A1* | 2/2011 | Tanzawa .............. H03K 17/162 257/659 |

(Continued)

FOREIGN PATENT DOCUMENTS

| CN | 101595567 | 12/2009 |
|---|---|---|
| CN | 101685231 | 3/2010 |

(Continued)

OTHER PUBLICATIONS

International Search Report and the Written Opinion dated Sep. 28, 2021 From the International Searching Authority Re. Application No. PCT/CN2021/080366 and Its Translation Into English. (14 Pages).

*Primary Examiner* — Sang V Nguyen (57) ABSTRACT

The present disclosure provides a display panel. The display panel includes a data line; a transistor electrically connected to the data line, wherein the transistor includes a patterned active layer disposed in an area corresponding to the data line; and a shielding layer disposed between the patterned active layer and the data line.

18 Claims, 8 Drawing Sheets

(56) References Cited

U.S. PATENT DOCUMENTS

| | | | |
|---|---|---|---|
| 2012/0133858 A1* | 5/2012 | Shin | G06F 3/0443 |
| | | | 349/59 |
| 2013/0194239 A1* | 8/2013 | Kato | H01L 27/14692 |
| | | | 438/73 |
| 2019/0187523 A1* | 6/2019 | Jian | G02F 1/1368 |
| 2019/0348479 A1* | 11/2019 | Huangfu | H10B 10/18 |
| 2020/0083309 A1* | 3/2020 | Wang | H10K 59/1216 |
| 2020/0110319 A1 | 4/2020 | Kawata et al. | |
| 2020/0264484 A1* | 8/2020 | Jinnai | H01L 29/78633 |
| 2023/0018774 A1* | 1/2023 | Wu | H01L 27/1222 |

FOREIGN PATENT DOCUMENTS

| | | |
|---|---|---|
| CN | 110890381 | 3/2020 |
| CN | 111341793 | 6/2020 |
| CN | 111584499 | 8/2020 |

* cited by examiner

DISPLAY PANEL

RELATED APPLICATIONS

This application is a National Phase of PCT Patent Application No. PCT/CN2021/080366 having International filing date of Mar. 12, 2021, which claims the benefit of priority of Chinese Patent Application No. 202110055616.9 filed on Jan. 15, 2021. The contents of the above applications are all incorporated by reference as if fully set forth herein in their entirety.

FIELD AND BACKGROUND OF THE INVENTION

The present disclosure relates to the field of display technology and more particularly to a display panel.

At present, virtual reality technology has been introduced into the military and the aviation fields, and high resolution is a development trend of virtual reality technology. The resolution of about 1000 introduced into the market still cannot meet the demand of high resolution virtual reality technology.

Therefore, it is necessary to propose a technical solution to improve resolution.

SUMMARY OF THE INVENTION

The purpose of the present disclosure is to provide a display panel that prevents the data line from affecting a normal operation of a patterned active layer when the data line and the patterned active layer are stacked to improve the resolution.

In order to achieve the above objectives, the technical solutions are as follows:

A display panel, including:

a substrate;

a data line disposed on the substrate;

a transistor disposed on the substrate and electrically connected to the data line, wherein the transistor comprises a patterned active layer, and the patterned active layer is disposed in an area corresponding to the data line;

a shielding layer disposed between the patterned active layer and the data line, and a thickness of the shielding layer is in a range from 450 angstroms to 550 angstroms; and a common electrode electrically connected to the shielding layer.

The present disclosure provides a display panel. A patterned active layer of a transistor electrically connected to a data line is disposed in an area corresponding to the data line, so that the patterned active layer and the data line overlapped in a thickness direction of the display panel, this arrangement reduces a space required for layout the patterned active layer and the data line, reduces a width of the repeating units, and is beneficial to the display panel to realize high-resolution display. In addition, a shielding layer is disposed between the patterned active layer and the data line to prevent a voltage of the data line from affecting the normal operation of the patterned active layer.

DESCRIPTION OF SPECIFIC EMBODIMENTS OF THE INVENTION

The technical solutions in the embodiments of the present disclosure will be clearly and completely described below in conjunction with the figures in the embodiments of the present disclosure. Obviously, the described embodiments are only a part of the embodiments of the present disclosure, rather than all the embodiments. Based on the embodiments in the present disclosure, all other embodiments obtained by those skilled in the art without inventive steps fall within the protection scope of the present disclosure.

Figure 1:
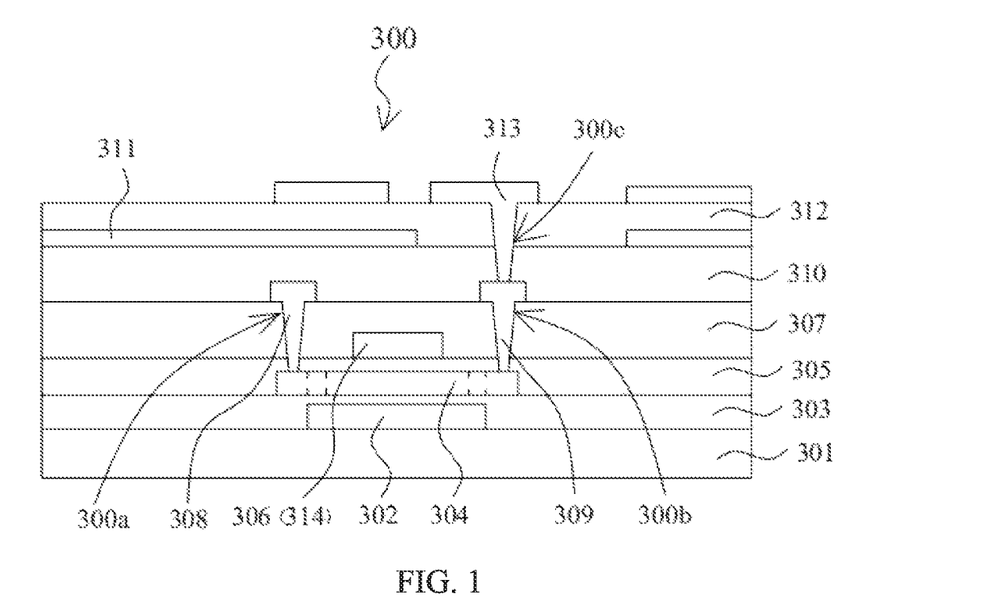
FIG. 1 is a schematic cross-sectional view of a display panel of conventional technology.
Figure 2:
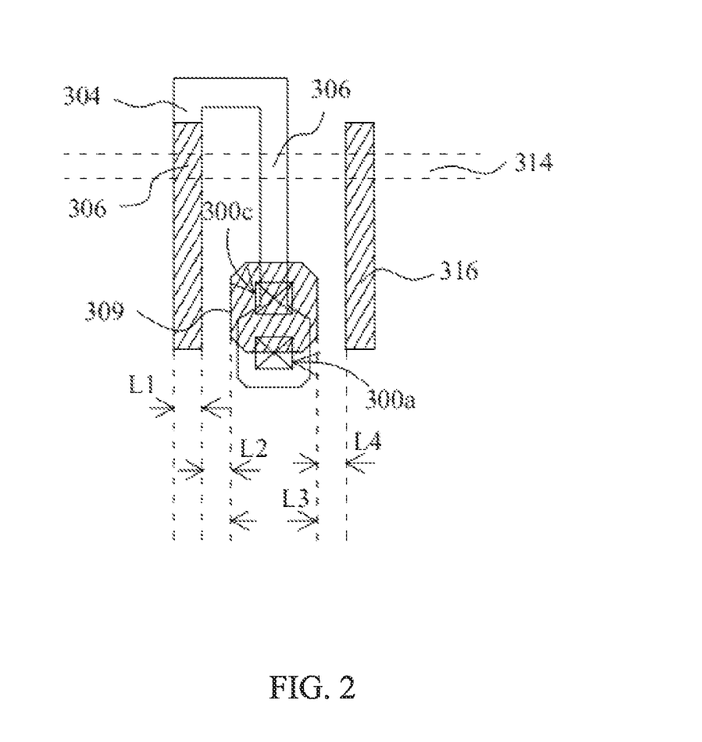
FIG. 2 is a schematic plan view of the display panel of FIG. 1.

Please refer to FIGS. 1 and 2. FIG. 1 is a schematic cross-sectional view of a display panel of conventional technology, and FIG. 2 is a schematic plan view of the display panel of FIG. 1. In the conventional technology, the display panel 300 includes a substrate 301, a light shielding layer 302, a buffer layer 303, a patterned active layer 304, a gate insulating layer 305, a gate electrode 306, an interlayer insulating layer 307, a source electrode 308, a drain electrode 309, a first passivation layer 310, a common electrode 311, a second passivation layer 312, a pixel electrode 313, a scan line 314, and a data line 316.

The light shielding layer 302 is disposed on the substrate 301. The buffer layer 303 covers the light shielding layer 302 and the substrate 301. The patterned active layer 304 is disposed on the buffer layer 303, and a channel of the patterned active layer 304 is shielded by the light shielding layer 302, wherein the patterned active layer 304 is U-shaped. The gate insulating layer 305 covers the patterned active layer 304 and the buffer layer 303. The scan line 314 is disposed on the gate insulating layer 305, portions where the scan line 314 and the patterned active layer 304 overlap are two gate electrodes, and portions where the patterned active layer 304 and the scan line 314 overlap are two channel regions. The interlayer insulating layer 307 covers the gate insulating layer 305 and the gate electrode 306. The source electrode 308 and the drain electrode 309 are disposed on the interlayer insulating layer 307, wherein the source electrode 308 is in contact with a portion corresponding to a source contact area of the patterned active layer 304 by a first connection through hole 300a penetrating the interlayer insulating layer 307 and the gate insulating layer 305, wherein the drain electrode 309 is electrically connected to a portion corresponding to a drain contact area of the patterned active layer 304 by a second connection through hole 300b penetrating the interlayer insulating layer 307 and the gate insulating layer 305. The data line 316, the source electrode 308, and the drain electrode 309 are disposed in a same layer. The first passivation layer 310 covers the source electrode 308, the drain electrode 309, and the interlayer insulating layer 307. The common electrode 311 is disposed on the first passivation layer 310. The second passivation layer 312 covers the first passivation layer 310 and the common electrode 311. The pixel electrode 313 is disposed on the second passivation layer 312, and the pixel electrode 313 is electrically connected to the drain electrode 309 by a third connection through hole 300c penetrating the second passivation layer 312 and the first passivation layer 310. In the conventional technology, the drain electrode 309 is disposed between two adjacent data lines 316, a width of the data line 316 is L1, a distance between the drain electrode 309 and one adjacent data line 316 is L2, a width of the drain electrode 309 is L3, a distance between the drain electrode 309 and another adjacent data line 316 is L4, and a width of the repeating unit composed of the data line 316, a transistor electrically connected to the data line 316, and a pixel electrode (not shown) etc. is L1+L2+L3+L4. Limited by process capabilities such as panel exposure, etc., a minimum metal line width can only be about 1.5 microns, a minimum size of through holes on the inorganic insulating layer is about 2 microns, and a minimum size of through holes on the organic insulating layer ranges from 3 microns to 5 microns. As a result, the minimum value of L1+L2+L3+L4 is about 7 microns to 8 microns. Correspondingly, a maximum resolution can only reach about 1000, and the resolution of about 1000 cannot meet the immersion demand of virtual reality technology.

In view of the problems of the traditional technology, the display panel of the present disclosure arranges the patterned active layer of the transistor electrically connected to the data line in an area corresponding to the data line, so that the patterned active layer and the data line are overlapped to reduce a width of the repeating unit composed of a data line, a transistor and a pixel electrode electrically connected to the data line, etc., and the source electrode and the drain electrode which are electrically connected to the patterned active layer are also disposed in the area corresponding to the data line. A through hole required for the electrical connection between the source electrode and the data line, a through hole required for the electrical connection between the source electrode and the patterned active layer, a through hole required for electrical connection between the drain electrode and the patterned active layer, and a through hole required for electrical connection between the drain electrode and the pixel electrode in the area corresponding to the data line are further defined so that the transistor electrically connected to the data line is disposed in the area corresponding to the data line, so that pixel electrodes are mainly provided between two adjacent data lines, so that a minimum width of the repeating unit is about 4 microns and a resolution of the display panel can reach at least 2000 within the current process capabilities, so that the resolution of the display panel is significantly improved and meets the demand for high resolution in the virtual reality field. In addition, the patterned active layer is disposed in the area corresponding to the data line, and a change in the data voltage transmitted by the data line will affect the normal operation of the patterned active layer. In the present disclosure, a shielding layer is provided between the patterned active layer and the data line to prevent changes in the data voltage from affecting the normal operation of the patterned active layer.

Figure 3:
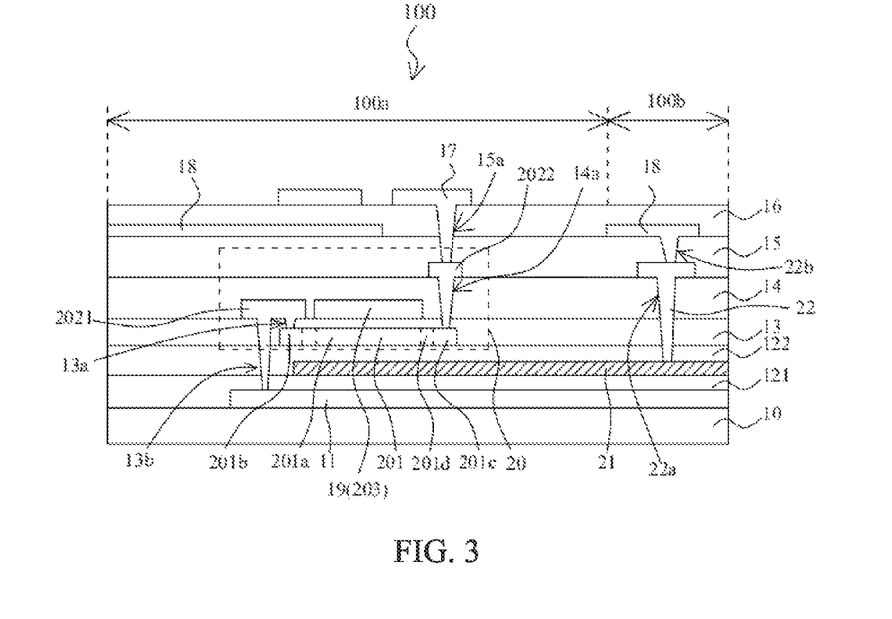
FIG. 3 is a schematic cross-sectional view of a display panel according to a first embodiment of the present disclosure.
Figure 4:
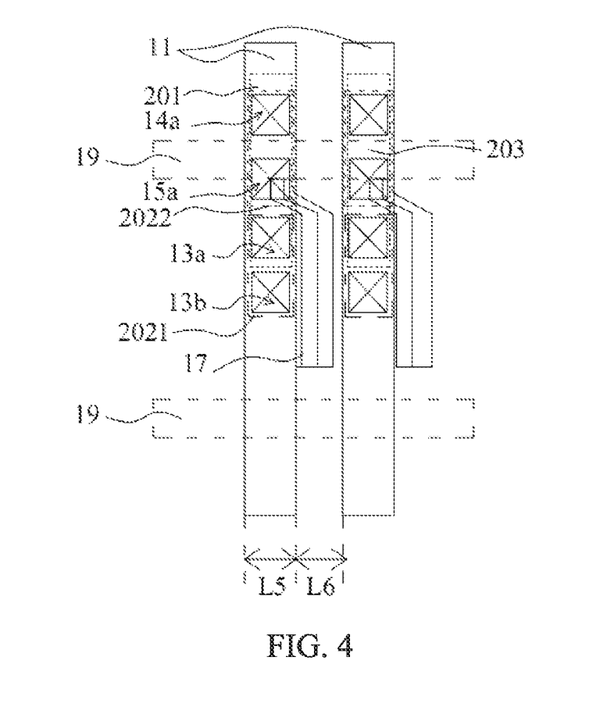
FIG. 4 is a schematic plan view of the display panel of FIG. 3.

Please refer to FIGS. 3 and 4. FIG. 3 is a schematic cross-sectional view of the display panel according to a first embodiment of the present disclosure, and FIG. 4 is a schematic plan view of the display panel of FIG. 3. The display panel 100 is a liquid crystal display panel. It can be understood that the display panel 100 may also be an organic light emitting diode display panel. The display panel 100 has a display region 100a and a peripheral region 100b, and the peripheral region 100b is located outside the display region 100a.

The display panel 100 includes a substrate 10, a data line 11, a first buffer layer 121, a second buffer layer 122, a gate insulating layer 13, an interlayer insulating layer 14, a first passivation layer 15, a second passivation layer 16, a transistor 20, a pixel electrode 17, a common electrode 18, a scan line 19, and a shielding layer 21. The transistor 20 is disposed in the display region 100a of the display panel 100.

The display panel 100 includes a plurality of repeating units disposed in an array and disposed in the display region 100a. Each repeating unit includes the data line 11, the transistor 20 and the pixel electrode 17, wherein the transistor 20 is electrically connected to the data line 11 and the pixel electrode 17.

In this embodiment, the substrate 10 is a glass substrate. It can be understood that the substrate 10 may also be a flexible substrate 10.

Figure 5:
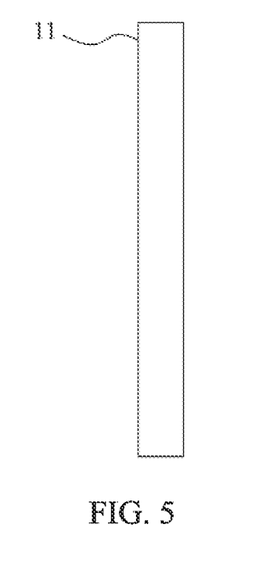
FIG. 5 is a schematic plan view of a data line of FIG. 4.

In this embodiment, the data line 11 is disposed on the substrate 10, and the data line 11 is located in the metal film layer where the traditional light shielding layer is located, which provides conditions for the data line 11 and the transistor 20 to overlap in the thickness direction of the display panel 100. While the data line 11 plays a role in transmitting data signals, the data line 11 also plays a role in shielding light. As shown in FIG. 4 and FIG. 5, FIG. 5 is a schematic plan view of the data line of FIG. 4. The data lines 11 are in a linear strip shape, and each data line 11 extends in a vertical direction, and a plurality of data lines 11 are disposed side by side in parallel. Unlike the traditional light-shielding layer having a thickness of 500 angstroms, the thickness of the data line 11 is greater than 500 angstroms, so that an impedance of the data line 11 meets the requirements for transmitting data signals. A thickness of the data line 11 ranges from 2000 to 4000 angstroms. For example, the thickness of the data line 11 is 3000 angstroms. The data line 11 is made of at least one material selected from molybdenum, aluminum, titanium, copper, or silver.

In this embodiment, the transistor 20 is electrically connected to the data line 11 and the pixel electrode 17, and the transistor 20 acts as a switch to control whether the data signal transmitted by the data line 11 is transmitted to the pixel electrode 17. The transistor 20 is a low temperature polysilicon transistor. It can be understood that the transistor 20 may also be a metal oxide transistor or an amorphous silicon transistor.

Figure 6:
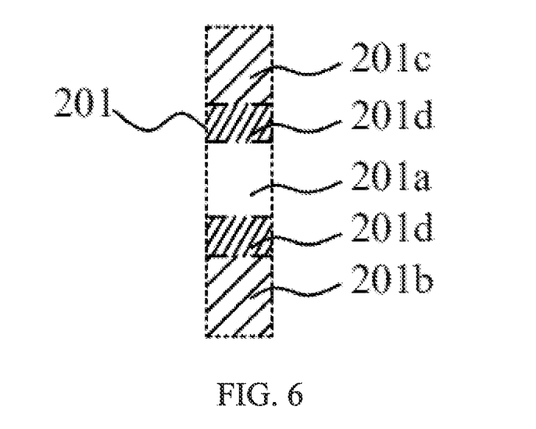
FIG. 6 is a schematic plan view of a patterned active layer of FIG. 4.

In this embodiment, the transistor 20 includes a patterned active layer 201, a source electrode 2021, a drain electrode 2022, and a gate electrode 203. As shown in FIGS. 4 and 6, the patterned active layer 201 has a channel region 201a, a source contact region 201*b*, a drain contact region 201*c*, and a lightly doped region 201*d*. The channel region 201*a* of the patterned active layer 201 is an area where the patterned active layer 201 overlaps the scan line 19. One lightly doped region 201*d* is disposed between the source contact region 201*b* and the channel region 201*a*, and the other lightly doped region 201*d* is disposed between the drain contact region 201*c* and the channel region 201*a*. A portion of the patterned active layer 201 corresponding to the channel region 201*a* and a portion of the patterned active layer 201 corresponding to the lightly doped region 201*d* are the channels of the patterned active layer 201. The source electrode 2021 is electrically connected to the data line 11 and a portion of the patterned active layer 201 corresponding to the source contact region 201*b*. The drain electrode 2022 is electrically connected to the pixel electrode 17 and a portion of the patterned active layer 201 corresponding to the drain contact region 201*c*.

In this embodiment, the patterned active layer 201 is disposed in an area corresponding to the data line 11, i.e., the patterned active layer 201 and the data line 11 are stacked in the thickness direction of the display panel 100. The patterned active layer 201 adopts the same linear strip shape design as the data line 11 and is disposed in parallel with the data line 11.

In the present disclosure, the patterned active layer 201 and the data line 11 are stacked to reduce a space required for disposing the patterned active layer 201 and the data line 11, so that a width of the repeating unit composed of the data line 11, the transistor 20 electrically connected to the data line 11, and the pixel electrode 17 is greatly reduced, which is beneficial to the improvement of the resolution of the display panel 100. In addition, the patterned active layer 201 and the data line 11 are overlapped so that the source electrode 2021, the drain electrode 2022, etc. of the transistor 20 are can be disposed in the area corresponding to the data line 11.

Further, an orthographic projection of the patterned active layer 201 on the substrate 10 is within an orthographic projection of the data line 11 on the substrate 10, i.e., a width of the data line 11 is greater than a width of the patterned active layer 201, and a length of the data line 11 is greater than a length of the corresponding patterned active layer 201, so that the data line 11 can completely shield the light incident to the channel of the patterned active layer 201, while avoiding the risk of climbing the patterned active layer 201, thereby preventing the patterned active layer 201 from rapid thermal annealing crystallization failure.

In addition, since the patterned active layer 201 is disposed corresponding to the data line 11, the data line 11 will be loaded with data signals. When turning off the gate electrode 203 of the transistor 20, a 5V data voltage transmitted by the data line 11 may cause the channel of the transistor 20 to turn on, which is equivalent of a situation where the data line 11 acts as a bottom gate and causes the transistor 20 to leak. In view of this, the present disclosure provides the shielding layer 21 between the patterned active layer 201 and the data line 11, and the shielding layer 21 shields the influence of the data voltage of the data line 11 on the patterned active layer 201.

In this embodiment, an orthographic projection of the channel of the patterned active layer 201 on the substrate 10 is located within an orthographic projection of the shielding layer 21 on the substrate 10, so that the shielding layer 21 shields the influence of the data signal transmitted by the data line on the channel of the patterned active layer. The first buffer layer 121 covers the data line 11 and the substrate 10, the shielding layer 21 is disposed on the first buffer layer 121, and the second buffer layer 122 covers the shielding layer 21 and the first buffer layer 121. A thickness of the shielding layer 21 ranges from 450 angstroms to 550 angstroms, e.g., the thickness of the shielding layer 21 is 500 angstroms, so as to avoid the problem of the annealing failure of the active layer when the shielding layer 21 is too thick. The shielding layer 21 may be made of transparent conductive material or metal. The transparent conductive material can be indium zinc oxide or indium tin oxide. The metal may be at least one of molybdenum, aluminum, titanium, copper, or silver.

In this embodiment, on the condition that the patterned active layer 201 overlaps the data line 11, at least one of the source electrode 2021 or the drain electrode 2022 electrically connected to the patterned active layer 201 may also be stacked on the data line 11 to further reduce the width of the repeating unit.

In this embodiment, the gate insulating layer 13 is disposed between the patterned active layer 201 and the source electrode 2021. The preparation material of the gate insulating layer 13 is selected from at least one of silicon nitride or silicon oxide.

Specifically, the gate insulating layer 13 covers the patterned active layer 201 and the second buffer layer 122, and the source electrode 2021 is disposed on the gate insulating layer 13. As shown in FIG. 4, the source electrode 2021 has a linear strip shape, the source electrode 2021 is parallel to the data line 11, and the source electrode 2021 is disposed in a region corresponding to the data line 11. For example, an orthographic projection of the source electrode 2021 on the substrate 10 is located in an orthographic projection of the data line 11 on the substrate 10.

In this embodiment, the gate insulating layer 13 is defined with a first through hole 13*a*, the source electrode 2021 and the portion of the patterned active layer 201 corresponding to the source contact region 201*b* are electrically connected by the first through hole 13*a*, and the first through hole 13*a* is provided in the area corresponding to the data line 11 to further reduce the width of the repeating unit, thereby increasing the resolution. Specifically, an orthographic projection of the first through hole 13*a* on the substrate 10 is located within the orthographic projection of the data line 11 on the substrate 10.

In this embodiment, the source electrode 2021 and the data line 11 are electrically connected by the second through hole 13*b* penetrating the gate insulating layer 13, the first buffer layer 121, and the second buffer layer 122, and the second through hole 13*b* is defined in the area corresponding to the data line 11, thereby further reducing the width of the repeating unit and further improve resolution. Specifically, an orthographic projection of the second through hole 13*b* on the substrate 10 is within the orthographic projection of the data line 11 on the substrate 10.

Figure 9:
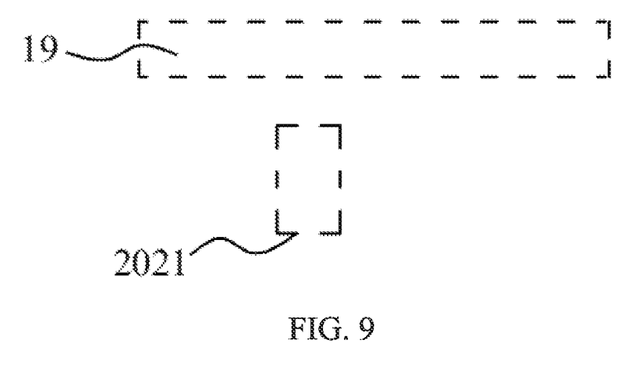
FIG. 9 is a schematic plan view of the scan line and a source of FIG. 4 in a same layer.

In this embodiment, as shown in FIG. 3 and FIG. 9, the scan line 19 and the source electrode 2021 are in a same layer and disposed separately, so that the source electrode 2021 and the data line 11 can be overlapped, which is beneficial to reducing the width of the repeating unit. In addition, when the data line 11 is provided in the film layer where the traditional light-shielding film layer is located, the scan line 19 and the source electrode 2021 are provided in the same layer, which is beneficial for the source electrode 2021 to electrically connect the data line 11 and a portion of the patterned active layer 201 corresponding to the source contact region 201*b*.

The scan line 19 is insulated from the data line 11 and intersects the data line 11 perpendicularly, and an intersection of the scan line 19 and the patterned active layer 201 correspond to the gate electrode 203 of the patterned active layer 201. Since the patterned active layer 201 perpendicularly intersects the scan line 19, the patterned active layer 201 has only one channel region 201a. Correspondingly, the transistor 20 is a transistor having one gate electrode. Compared with the traditional transistor which is a transistor with a double gate electrode, the transistor 20 with one gate electrode in the present disclosure can also be configured as a switch.

In this embodiment, since the data line 11 and the source electrode 2021 are electrically connected by the second through hole 13b, the second through hole 13b is defined corresponding to the data line 11, and the shielding layer 21 is provided corresponding to the data line 11 and parallel to the data line 11. The shielding layer 21 needs to be dug out to avoid the second through hole 13b. The dug-out design and the source electrode 2021 passing through the through hole on the shielding layer 21 to be electrically connected to the data line 11 will increase the complexity of the manufacturing process. In view of this, in the present disclosure, the shielding layer 21 is disposed corresponding to the scan line 19 and parallel to the scan line 19 so as to realize the shielding function of the shielding layer 21 while avoiding the need for digging the shielding layer 21.

Figure 7:
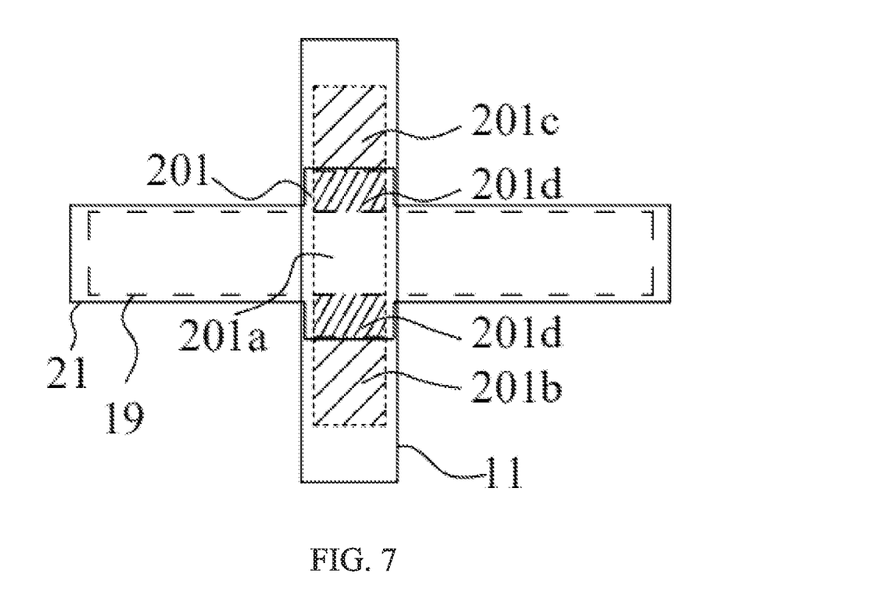
FIG. 7 is a schematic plan view of a layout of a shielding layer, the patterned active layer, scan lines, and the data lines.
Figure 8:
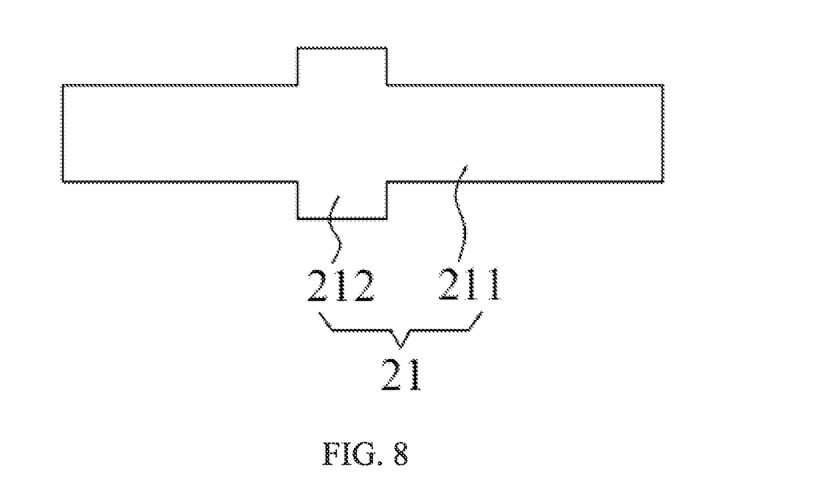
FIG. 8 is a schematic plan view of the shielding layer of FIG. 7.

Specifically, as shown in FIGS. 7 and 8, FIG. 7 is a schematic plan view of the layout of the shielding layer, patterned active layer, scan lines, and data lines, and FIG. 8 is a plan view of the shielding layer in FIG. 7. The shielding layer 21 includes a main shielding portion 211, which is disposed corresponding to the scan line 19 and parallel to the scan line 19 to prevent the portion of the patterned active layer 201 corresponding to the channel region 201a from being affected by the data signal transmitted by the data line 11. A width of the main shielding portion 211 is greater than or equal to a width of the scan line 19.

Further, the shielding layer 21 further includes a shielding extension portion 212, which extends from the main shielding portion 211 and is provided corresponding to a portion of the patterned active layer 201 corresponding to the lightly doped region 201d, so as to further prevent the data signal transmitted by the data line 11 from affecting the portion of the patterned active layer 201 corresponding to the lightly doped region 201d, and further prevent the channel of the patterned active layer 201 from being affected by the data signal transmitted by the data line 11.

In this embodiment, the interlayer insulating layer 14 is disposed between the source electrode 2021 and the drain electrode 2022, and the drain electrode 2022 is electrically connected to the portion of the patterned active layer 201 corresponding to the drain contact region 201c by the third through hole 14a. The third through hole 14a penetrates the interlayer insulating layer 14 and the gate insulating layer 13, and the third through hole 14a is defined in the area corresponding to the data line 11 to further reduce the width of the repeating unit and thereby improving resolution.

Figure 10:
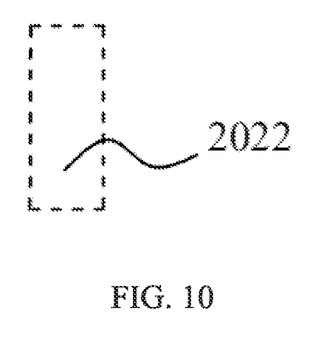
FIG. 10 is a schematic diagram of a drain of FIG. 4.

Specifically, as shown in FIG. 3 and FIG. 10, the drain electrode 2022 is disposed on the interlayer insulating layer 14, and the drain electrode 2022 is disposed corresponding to the data line 11, and the drain electrode 2022 has a linear strip shape. An orthographic projection of the third through hole 14a on the substrate 10 is within the orthographic projection of the data line 11 on the substrate 10. A material for preparing the interlayer insulating layer 14 is selected from at least one of silicon nitride or silicon oxide.

In this embodiment, the first passivation layer 15 and the second passivation layer 16 are disposed between the drain electrode 2022 and the pixel electrode 17, the first passivation layer 15 is disposed close to the drain electrode 2022, and the second passivation layer 16 is disposed close to the pixel electrode 17. The pixel electrode 17 and the drain electrode 2022 are electrically connected by a fourth through hole 15a penetrating the first passivation layer 15 and the second passivation layer 16, and the fourth through hole 15a is defined in the region corresponding to the data line 11.

Specifically, the first passivation layer 15 covers the drain electrode 2022 and the interlayer insulating layer 14, the common electrode 18 is disposed on the first passivation layer 15, and the second passivation layer 16 covers the common electrode 18 and the first passivation layer 15, the pixel electrode 17 is disposed on the second passivation layer 16. The orthographic projection of the fourth through hole 15a on the substrate 10 is within the orthographic projection of the data line 11 on the substrate. Among them, the first passivation layer 15 is an inorganic insulating layer, and the second passivation layer 16 is also an inorganic insulating layer.

It can be understood that the first passivation layer 15 may be an organic insulating layer, and the second passivation layer 16 is an inorganic insulating layer. Compared with the first passivation layer 15 being an inorganic insulating layer, the size of the fourth through hole 15a is about 1.5 microns, and the first passivation layer 15 is an organic insulating layer so that a size of the fourth through hole 15a is about 3 microns to 5 microns. The first passivation layer 15 being an organic insulating layer will cause the fourth through hole 15a to occupy more space.

In this embodiment, the pixel electrode 17 is disposed in an area between two adjacent data lines 11. The pixel electrode 17 and the common electrode 18 are made of transparent metal oxide.

In this embodiment, as shown in FIG. 4, a width of a repeating unit is equal to a sum of a width L5 of the data line 11 and a distance L6 between two adjacent data lines 11. The distance L6 mainly depends on the width of the pixel electrode. Within the current process capabilities of the display panel, a minimum value of L5+L6 can be about 4 microns.

In this embodiment, the display panel 100 further includes a connecting wire 22 disposed in the peripheral region 100b, the shielding layer 21 extends from the display region 100a to the peripheral region 100b, one terminal of the connecting wire 22 is electrically connected to the common electrode 18, and another terminal of the connecting wire 22 is electrically connected to the shielding layer 21, so that the shielding layer 21 transmits a common voltage signal, and the shielding layer 21 transmits a fixed voltage signal for shielding.

Specifically, the connecting wire 22 and the drain electrode 2022 are disposed in a same layer and are electrically connected to the shielding layer 21 by a sixth through hole 22a penetrating the interlayer insulating layer 14, the gate insulating layer 13, and the second buffer layer 122, and electrically connected to the common electrode 18 by a seventh through hole 22b on the passivation layer 15.

In the display panel of this embodiment, by disposing the patterned active layer of the transistor in the area corresponding to the data line electrically connected to the transistor, a source electrode electrically connected the patterned active layer and the data line and the corresponding though hole, a drain electrode electrically connected the patterned active layer and pixel electrode and the corresponding through hole, are all disposed in the area corresponding to the data line, so that the transistor and the data line are overlapped, and the width of the repeating unit is minimized.

Figure 11:
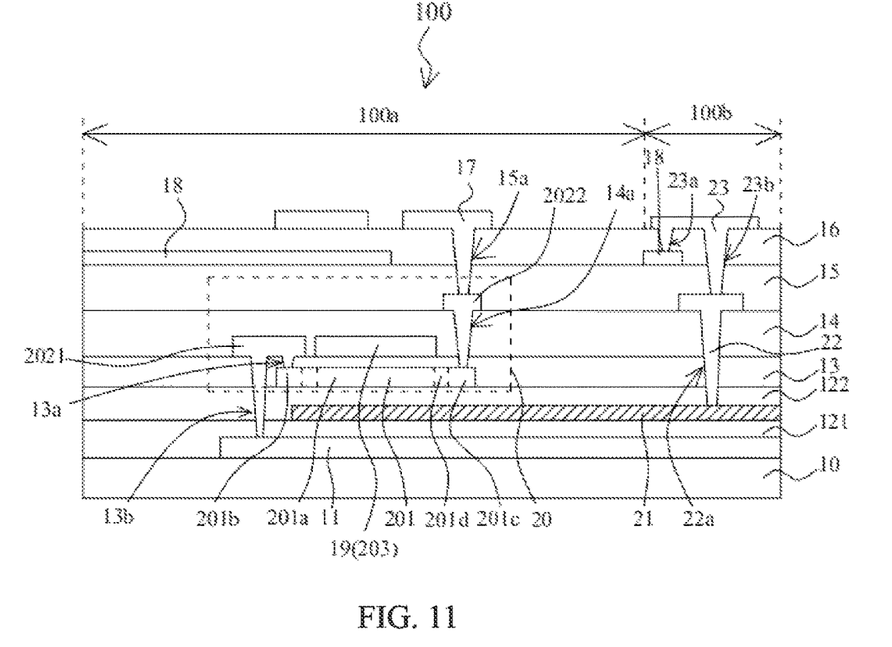
FIG. 11 is a schematic cross-sectional view of a display panel according to a second embodiment of the present disclosure.

As shown in FIG. 11, FIG. 11 is a schematic cross-sectional view of the display panel according to a second embodiment of the present disclosure. The display panel shown in FIG. 11 is basically similar to the display panel shown in FIG. 3, except that the display panel 100 further includes a bridge wire 23 and a connecting wire 22 disposed in the peripheral region 100b, and the connecting wire 22 and the drain electrode 2022 are disposed in the same layer, the bridging wire 23 and the pixel electrode 17 are disposed in a same layer, and the bridging wire 23 bridges the connecting wire 22 and the common electrode 18 of the peripheral region 100b.

Specifically, the connecting wire 22 and the drain electrode 2022 are provided in the same layer, and the connecting wire 22 is electrically connected to the shielding layer 21 by the sixth through hole 22a penetrating the interlayer insulating layer 14, the gate insulating layer 13, and the second buffer layer 122. The bridging wire 23 is provided in the same layer as the pixel electrode 17, one terminal of the bridging wire 23 is electrically connected to the common electrode 18 by the eighth through hole 23a penetrating the second passivation layer 16, and another terminal of the bridging wire 23 is connected to the connecting wire 23 by the ninth through hole 23b penetrating the first passivation layer 15 and the second passivation layer 16.

Figure 12:
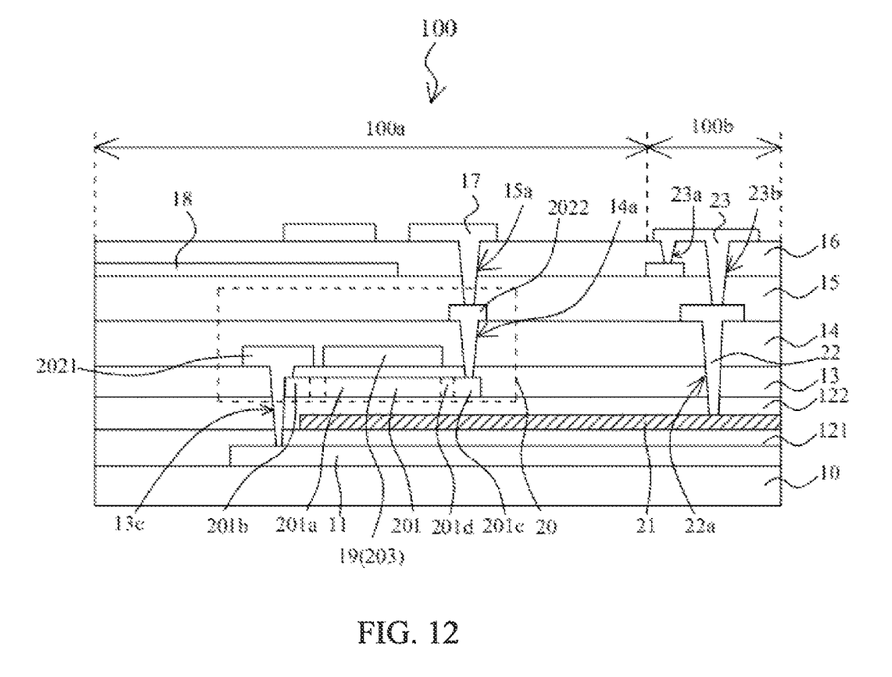
FIG. 12 is a schematic cross-sectional view of a display panel according to a third embodiment of the present disclosure.
Figure 13:
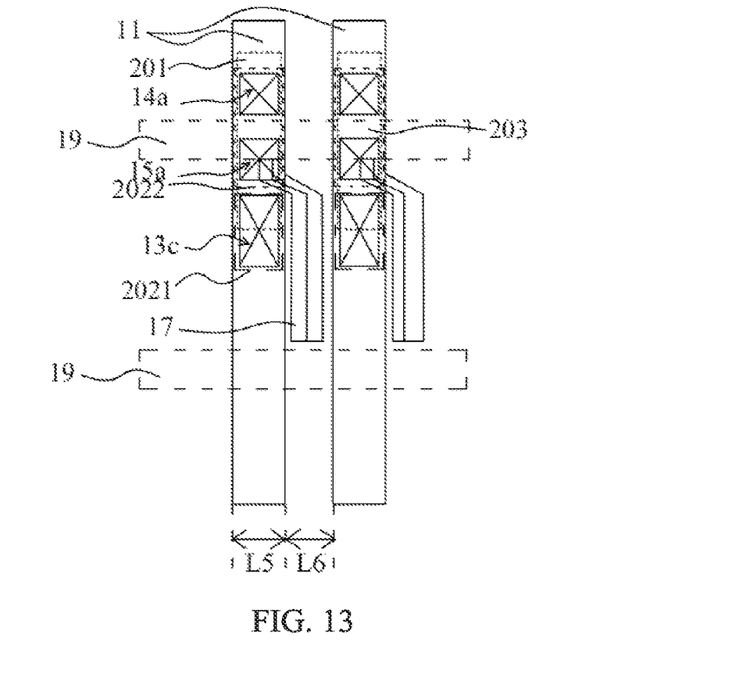
FIG. 13 is a schematic plan view of the display panel of FIG. 12.

As shown in FIGS. 12 and 13, FIG. 12 is a schematic cross-sectional view of a display panel according to a third embodiment of the present disclosure, and FIG. 13 is a schematic plan view of the display panel of FIG. 12. The display panel shown in FIG. 12 is basically similar to the display panel shown in FIG. 11, except that the source electrode 2021 electrically connected to the data line 11 and the part of the source contact area 201b corresponding to the patterned active layer 201 by the tenth through hole 13c penetrating the gate insulating layer 13, the second buffer layer 122, and the first buffer layer 121.

Figure 14:
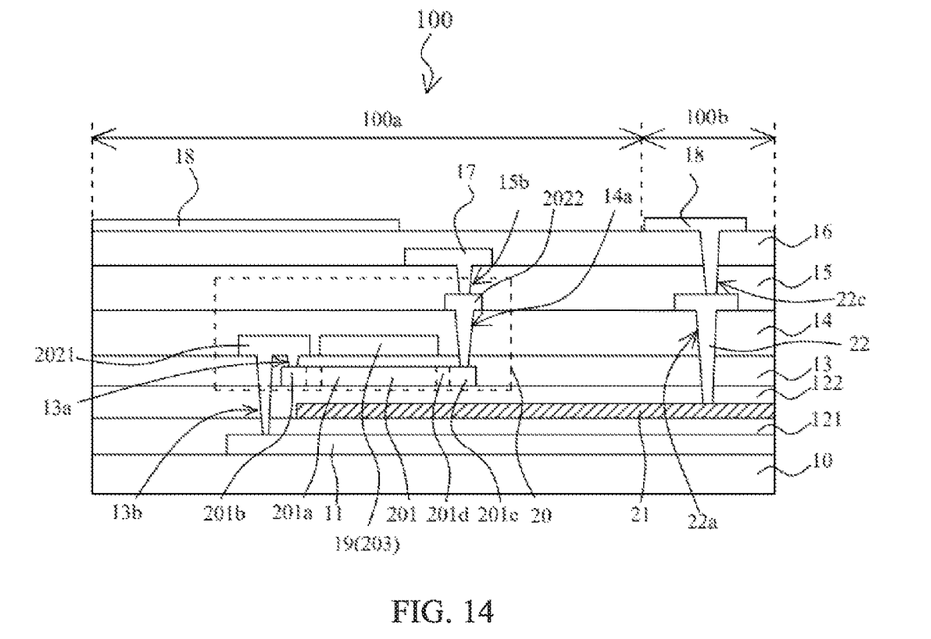
FIG. 14 is a schematic cross-sectional view of a display panel according to a fourth embodiment of the present disclosure.

As shown in FIG. 14, FIG. 14 is a schematic cross-sectional view of a display panel according to a fourth embodiment of the present disclosure. The display panel shown in FIG. 14 is basically similar to the display panel shown in FIG. 3, except that the pixel electrode 17 is disposed on the first passivation layer 15 and the common electrode 18 is disposed on the second passivation layer 16. The pixel electrode 17 is electrically connected to the drain electrode 2022 by the eleventh through hole 15b on the first passivation layer 15, and the common electrode 18 in the peripheral region 100b is electrically connected to the connecting wire 22 by the twelfth through hole 22c penetrating the first passivation layer 15 and the second passivation layer 16.

Figure 15:
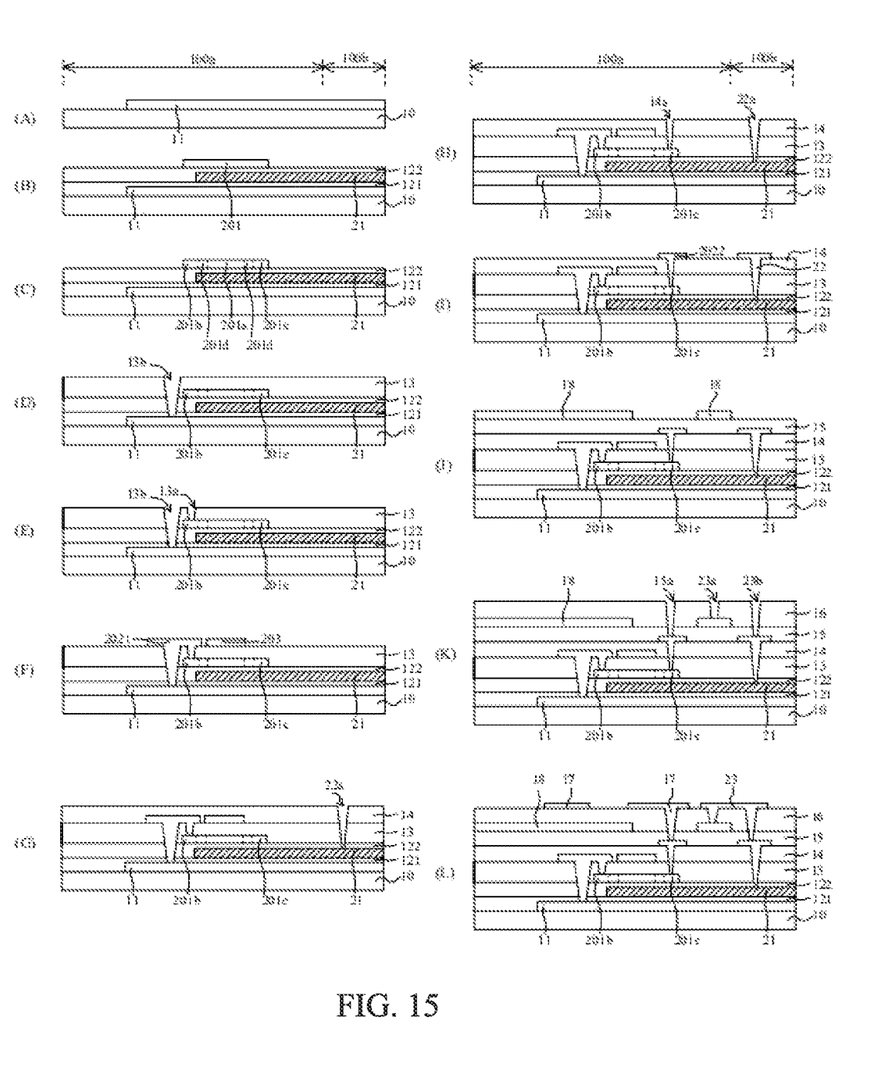
FIG. 15 is a schematic diagram of a process of manufacturing the display panel of FIG. 11.

The present disclosure also provides a manufacturing method of a display panel. Taking the display panel shown in FIG. 11 as an example, the manufacturing method of the display panel includes the following steps:

S101: As shown in A of FIG. 15, a data line 11 is formed on the substrate 10, and the data line 11 extends from the display region 100a to the peripheral region 100b.

S102: As shown in B of FIG. 15, forming a first buffer layer 121 covering the data line 11 and the substrate 10, and forming a shielding layer 21 on the first buffer layer 121 that extends from the display region 100a to the peripheral region 100b. Forming a second buffer layer 122 covering the shielding layer 21 and the first buffer layer 121, and forming a patterned active layer 201 on the second buffer layer 122. The patterned active layer 201 is disposed corresponding to the data line 11.

S103: As shown in C of FIG. 15, ion doping is performed on part of the patterned active layer to form the lightly doped region 201d, the source contact region 201b, and the drain contact region 201c, a region between the two lightly doped regions 201d is the channel region 201a and has not undergone ion doping treatment. An ion doping concentration of the portion of the patterned active layer 201 corresponding to the source contact region 201b and the drain contact region 201c is more than an ion doping concentration of the portion of the patterned active layer 201 corresponding to the lightly doped region 201d.

S104: As shown in D of FIG. 15, forming a gate insulating layer 13 covering the patterned active layer 201, and forming a second through hole 13b penetrating the gate insulating layer 13, the first buffer layer 121, and the second buffer layer 122 in the display region 100a, wherein the second through hole 13b is defined in the area corresponding to the data line 11 and exposes the data line 11.

S105: As shown in E of FIG. 15, forming a first through hole 13a penetrating the gate insulating layer 13 in the display region 100a, wherein the first through hole 13a is defined in a region corresponding to the data line 11, and the first through hole 13a exposing a portion of the patterned active layer 201 corresponding to the source contact region 201b. The first through hole 13a and the second through hole 13b are defined separately.

S106: As shown in F of FIG. 15, while forming the source electrode 2021 in the first through hole 13a, the second through hole 13b, and on the gate insulating layer 13, forming a gate electrode 203 on the gate insulating layer 13. The source electrode 2021 is electrically connected to a portion of the patterned active layer 201 corresponding to the source contact region 201b by the first through hole 13a, and the source electrode 2021 is electrically connected to the data line 11 by the second through hole 13b.

S107: As shown in G of FIG. 15, forming an interlayer insulating layer 14 covering the gate insulating layer 13, the gate electrode 203 and the source electrode 2021, forming the sixth through hole 22a penetrating the interlayer insulating layer 14, the gate insulating layer 13, and the second buffer layer 122, wherein the sixth through hole 22a is located in the peripheral region 100b and exposes the shielding layer 21.

S108: As shown in H of FIG. 15, forming a third through hole 14a penetrating the interlayer insulating layer 14 and the gate insulating layer 13. The third through hole 14a makes the patterned active layer 201 correspond to the drain contact region 201c partially exposed. The third through hole 14a is defined in an area corresponding to the data line 11.

S109: As shown in I of FIG. 15, forming the drain electrode 2022 in the third through hole 14a and on the interlayer insulating layer 14, and forming a connecting wire 22 in the sixth through hole 22a and on the interlayer insulating layer 14. The drain electrode 2022 is electrically connected to the portion of the patterned active layer 201 corresponding to the drain contact area 201c by the third through hole 14a, and the connecting wire 22 is electrically connected to the shielding layer 21 by the sixth through hole 22a.

S110: As shown in J of FIG. 15, forming a first passivation layer 15 covering the connecting wire 22, forming the drain electrode 2022, and the interlayer insulating layer 14, and forming a common electrode 18 on the first passivation layer 15.

S111: As shown in K of FIG. 15, forming a second passivation layer 16 covering the common electrode 18 and the first passivation layer 15, and forming a ninth the hole 23b and the fourth through hole 15a penetrating first passivation layer 15 and the second passivation layer 16, at the same time forming an eighth through hole 23a penetrating the second passivation layer 16. The fourth through hole 15a is defined in a region corresponding to the data line 11 and exposes the drain electrode 2022, and the fourth through hole 15a is located in the display region 100a. The eighth through hole 23a exposes the common electrode 18 located in the peripheral region 100b. The ninth through hole 23b exposes the connection wire 22.

S112: As shown in L of FIG. 15, forming the pixel electrode 17 on the second passivation layer 16 of the display region 100a, and forming the bridging wire 23 in the eighth through hole 23a and the ninth through hole 23b and on the second passivation layer 16. The pixel electrode 17 is electrically connected to the drain electrode. The bridging wire 23 bridges the common electrode 18 and the connecting wire 22.

The description of the above embodiments is only used to help understand the technical solutions and core ideas of the present disclosure; those of ordinary skill in the art should understand that they can still modify the technical solutions recorded in the foregoing embodiments, or equivalently replace some of the technical features. However, these modifications or replacements do not cause the essence of the corresponding technical solutions to deviate from the scope of the technical solutions of the embodiments of the present disclosure.

What is claimed is:

1. A display panel, comprising:
   a substrate;
   a data line disposed on the substrate;
   a transistor disposed on the substrate and electrically connected to the data line, wherein the transistor comprises a patterned active layer, and the patterned active layer is disposed in an area corresponding to the data line;
   a shielding layer disposed between the patterned active layer and the data line, and a thickness of the shielding layer ranges from 450 angstroms to 550 angstroms; and
   a common electrode electrically connected to the shielding layer;
   wherein the data line is disposed on the substrate, and the display panel further comprises a first buffer layer covering the data line and the substrate and a second buffer layer covering the first buffer layer and the shielding layer;
   wherein the shielding layer is disposed on the first buffer layer, and the patterned active layer is disposed on the second buffer layer and corresponding to the data line.

2. The display panel according to claim 1, wherein the patterned active layer comprises a channel, and an orthographic projection of the channel of the patterned active layer on the substrate is located in an orthographic projection of the shielding layer on the substrate.

3. The display panel according to claim 1, wherein the display panel further comprises a scan line insulated from and intersecting the data line,
   and the shielding layer comprises a main shielding portion, and the main shielding portion is disposed corresponding to the scan line and is parallel to the scan line.

4. The display panel according to claim 3, wherein the patterned active layer comprises a lightly doped region, and the shielding layer further comprises:
   a shielding extension portion that extends from the main shielding portion and is disposed corresponding to a portion of the patterned active layer corresponding to the lightly doped region.

5. The display panel according to claim 1, wherein the display panel further comprises a peripheral region, and the display panel further comprises:
   a connecting wire disposed in the peripheral region, one terminal of the connecting wire is electrically connected to the common electrode, and another terminal of the connecting wire is electrically connected to the shielding layer.

6. The display panel according to claim 1, wherein the display panel further comprises a peripheral region, and the display panel further comprises:
   a pixel electrode disposed on a side of the common electrode away from the shielding layer;
   a connecting wire disposed in the peripheral region and electrically connected to the shielding layer; and
   a bridging wire disposed in the peripheral region and in a same layer as the pixel electrode, insulated from the pixel electrode, and bridging the connecting wire and the common electrode.

7. The display panel according to claim 1, wherein the patterned active layer comprises a source contact area and a drain contact area, the transistor further comprises a source electrode and a drain electrode, and the display panel further comprises:
   a gate insulating layer covering the patterned active layer and the second buffer layer, wherein the source electrode is disposed on the gate insulating layer, electrically connected to a portion of the patterned active layer corresponding to the source contact area by a first through hole penetrating the gate insulating layer, and electrically connected to the data line by a second through hole penetrating the gate insulating layer, the second buffer layer, and the first buffer layer; and
   an interlayer insulating layer covering the source electrode and the gate insulating layer, wherein the drain electrode is disposed on the interlayer insulating layer and electrically connected to a portion of the patterned active layer corresponding to the drain contact area by a third through hole penetrating the interlayer insulating layer and the gate insulating layer,
   wherein the source electrode, the drain electrode, the first through hole, the second through hole, and the third through hole are all defined in a region corresponding to the data line.

8. The display panel according to claim 7, wherein the display panel further comprises a pixel electrode and a passivation layer, the passivation layer is disposed between the pixel electrode and the drain electrode; and
   the drain electrode and the pixel electrode are electrically connected by a fourth through hole defined on the passivation layer, wherein the fourth through hole is defined in the region corresponding to the data line.

9. A display panel, comprising:
   a substrate;
   a data line disposed on the substrate;
   a transistor disposed on the substrate and electrically connected to the data line, wherein the transistor comprises a patterned active layer, and the patterned active layer is disposed in an area corresponding to the data line; and a shielding layer disposed between the patterned active layer and the data line;

wherein the data line is disposed on the substrate, and the display panel further comprises a first buffer layer covering the data line and the substrate and a second buffer layer covering the first buffer layer and the shielding layer;

wherein the shielding layer is disposed on the first buffer layer, and the patterned active layer is disposed on the second buffer layer and corresponding to the data line.

10. The display panel according to claim 9, wherein the patterned active layer comprises a channel, and an orthographic projection of the channel of the patterned active layer on the substrate is located in an orthographic projection of the shielding layer on the substrate.

11. The display panel according to claim 9, wherein the display panel further comprises a scan line insulated from and intersecting the data line, and the shielding layer comprises a main shielding portion, and the main shielding portion is disposed corresponding to the scan line and is parallel to the scan line.

12. The display panel according to claim 11, wherein the patterned active layer comprises a lightly doped region, and the shielding layer further comprises:

a shielding extension portion that extends from the main shielding portion and is disposed corresponding to a portion of the patterned active layer corresponding to the lightly doped region.

13. The display panel according to claim 9, wherein the display panel further comprises a common electrode electrically connected to the shielding layer.

14. The display panel according to claim 13, wherein the display panel further comprises a peripheral region, and the display panel further comprises:

a connecting wire disposed in the peripheral region, one terminal of the connecting wire is electrically connected to the common electrode, and another terminal of the connecting wire is electrically connected to the shielding layer.

15. The display panel according to claim 13, wherein the display panel further comprises a peripheral region, and the display panel further comprises:

a pixel electrode disposed on a side of the common electrode away from the shielding layer;

a connecting wire disposed in the peripheral region and electrically connected to the shielding layer; and a bridging wire disposed in the peripheral region and in a same layer as the pixel electrode, insulated from the pixel electrode, and bridging the connecting wire and the common electrode.

16. The display panel according to claim 9, wherein a thickness of the shielding layer ranges from 450 angstroms to 550 angstroms.

17. The display panel according to claim 9, wherein the patterned active layer comprises a source contact area and a drain contact area, the transistor further comprises a source electrode and a drain electrode, and the display panel further comprises:

a gate insulating layer covering the patterned active layer and the second buffer layer, wherein the source electrode is disposed on the gate insulating layer, electrically connected to a portion of the patterned active layer corresponding to the source contact area by a first through hole penetrating the gate insulating layer, and electrically connected to the data line by a second through hole penetrating the gate insulating layer, the second buffer layer, and the first buffer layer; and an interlayer insulating layer covering the source electrode and the gate insulating layer, wherein the drain electrode is disposed on the interlayer insulating layer, and electrically connected to a portion of the patterned active layer corresponding to the drain contact area by a third through hole penetrating the interlayer insulating layer and the gate insulating layer, wherein the source electrode, the drain electrode, the first through hole, the second through hole, and the third through hole are all defined in a region corresponding to the data line.

18. The display panel according to claim 17, wherein the display panel further comprises a pixel electrode and a passivation layer, the passivation layer is disposed between the pixel electrode and the drain electrode; and the drain electrode and the pixel electrode are electrically connected by a fourth through hole defined on the passivation layer, wherein the fourth through hole is defined in the region corresponding to the data line.

* * * * *